United States Patent
Naito

(10) Patent No.: US 7,161,509 B2
(45) Date of Patent: Jan. 9, 2007

(54) VARIABLE-LENGTH CODE DECODING APPARATUS AND METHOD

(75) Inventor: Satoshi Naito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/284,010

(22) Filed: Nov. 21, 2005

(65) Prior Publication Data

US 2006/0109150 A1    May 25, 2006

(30) Foreign Application Priority Data

Nov. 25, 2004    (JP) .............................. 2004-340806

(51) Int. Cl.
*H03M 7/40* (2006.01)
(52) U.S. Cl. .................. 341/67; 382/246; 375/240.23
(58) Field of Classification Search .................. 341/67; 375/240.23; 382/246
See application file for complete search history.

(56) References Cited

U.S. PATENT DOCUMENTS

| | | | | |
|---|---|---|---|---|
| 4,647,908 A | * | 3/1987 | Ross et al. ..................... | 341/67 |
| 5,883,589 A | * | 3/1999 | Takishima et al. ............. | 341/67 |
| 7,102,550 B1 | * | 9/2006 | Watanabe et al. ............. | 341/67 |
| 2005/0147172 A1 | * | 7/2005 | Winger et al. ......... | 375/240.23 |
| 2005/0259742 A1 | * | 11/2005 | Hellman ................. | 375/240.23 |
| 2006/0109150 A1 | * | 5/2006 | Naito .......................... | 340/67 |
| 2006/0119490 A1 | * | 6/2006 | Lim et al. ..................... | 341/50 |

FOREIGN PATENT DOCUMENTS

JP     2004-134896     4/2004

\* cited by examiner

*Primary Examiner*—Howard L. Williams
(74) *Attorney, Agent, or Firm*—Cowan, Liebowitz & Latman, P.C.

(57) ABSTRACT

There are provided a variable-length code decoding apparatus and method which can perform high-speed decoding processing without decreasing an image size and frame rate. A variable-length code decoding apparatus of this invention decodes a variable-length code containing a prefix and a suffix. This apparatus includes a prefix decoding unit which decodes the prefix of an input variable-length code and outputs a symbol and prefix length corresponding to the prefix, a suffix shifter unit which supplies the suffix on the basis of the prefix length output from the prefix decoding unit, and a symbol decoding unit which decodes a symbol corresponding to a variable-length code on the basis of the symbol corresponding to the prefix which is output from the prefix decoding unit, the suffix supplied by the suffix shifter unit, and a suffix length acquired in advance.

12 Claims, 15 Drawing Sheets

FIG. 1A
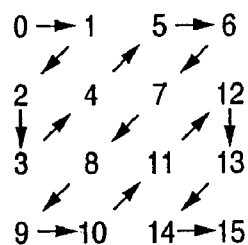
FIG. 1B
| 18 | 10 | 3  | 0 |
|----|----|----|---|
| 8  | 5  | 2  | 0 |
| 0  | 0  | -1 | 1 |
| 0  | 1  | 0  | 0 |
FIG. 1C
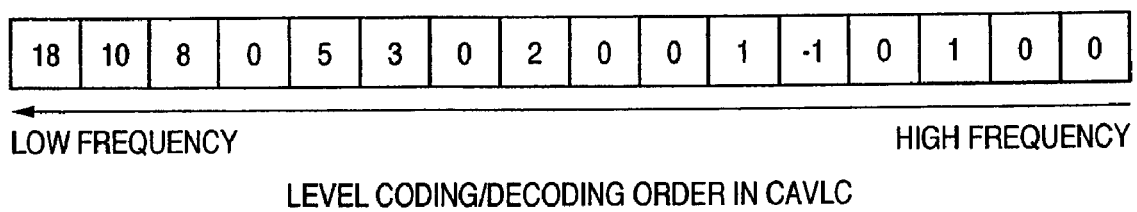
LOW FREQUENCY            HIGH FREQUENCY
LEVEL CODING/DECODING ORDER IN CAVLC

FIG. 2

| level_prefix_code | level_prefix | prefixLength |
|---|---|---|
| 1 | 0 | 1 |
| 01 | 1 | 2 |
| 001 | 2 | 3 |
| 0001 | 3 | 4 |
| 00001 | 4 | 5 |
| 000001 | 5 | 6 |
| 0000001 | 6 | 7 |
| 00000001 | 7 | 8 |
| 000000001 | 8 | 9 |
| 0000000001 | 9 | 10 |
| 00000000001 | 10 | 11 |
| 000000000001 | 11 | 12 |
| 0000000000001 | 12 | 13 |
| 00000000000001 | 13 | 14 |
| 000000000000001 | 14 | 15 |
| 0000000000000001 | 15 | 16 |

FIG. 3

| level_prefix | level_suffix_code | level | vlcLength |
|---|---|---|---|
| 0 | | 1 | 1 |
| 1 | | -1 | 2 |
| 2 | | 2 | 3 |
| 3 | | -2 | 4 |
| 4 | | 3 | 5 |
| 5 | | -3 | 6 |
| 6 | | 4 | 7 |
| 7 | | -4 | 8 |
| 8 | | 5 | 9 |
| 9 | | -5 | 10 |
| 10 | | 6 | 11 |
| 11 | | -6 | 12 |
| 12 | | 7 | 13 |
| 13 | | -7 | 14 |
| 14 | xxxs | ±8~±15 | 19 |
| 15 | xxxx xxxx xxxs | ±16~±2063 | 28 |

FIG. 4

| level_prefix | level_suffix_code | level | vlcLength |
|---|---|---|---|
| 0 | s | ±1 | 2 |
| 1 | s | ±2 | 3 |
| 2 | s | ±3 | 4 |
| 3 | s | ±4 | 5 |
| 4 | s | ±5 | 6 |
| 5 | s | ±6 | 7 |
| 6 | s | ±7 | 8 |
| 7 | s | ±8 | 9 |
| 8 | s | ±9 | 10 |
| 9 | s | ±10 | 11 |
| 10 | s | ±11 | 12 |
| 11 | s | ±12 | 13 |
| 12 | s | ±13 | 14 |
| 13 | s | ±14 | 15 |
| 14 | s | ±15 | 16 |
| 15 | xxxx xxxx xxxs | ±16～±2063 | 28 |

FIG. 5

| level_prefix | level_suffix_code | level | vlcLength |
|---|---|---|---|
| 0 | xs | ±1~±2 | 3 |
| 1 | xs | ±3~±4 | 4 |
| 2 | xs | ±5~±6 | 5 |
| 3 | xs | ±7~±8 | 6 |
| 4 | xs | ±9~±10 | 7 |
| 5 | xs | ±11~±12 | 8 |
| 6 | xs | ±13~±14 | 9 |
| 7 | xs | ±15~±16 | 10 |
| 8 | xs | ±17~±18 | 11 |
| 9 | xs | ±19~±20 | 12 |
| 10 | xs | ±21~±22 | 13 |
| 11 | xs | ±23~±24 | 14 |
| 12 | xs | ±25~±26 | 15 |
| 13 | xs | ±27~±28 | 16 |
| 14 | xs | ±29~±30 | 17 |
| 15 | xxxx xxxx xxxs | ±31~±2063 | 28 |

FIG. 6

| level_prefix | level_suffix_code | level | vlcLength |
|---|---|---|---|
| 0 | xxs | ±1～±4 | 4 |
| 1 | xxs | ±5～±8 | 5 |
| 2 | xxs | ±9～±12 | 6 |
| 3 | xxs | ±13～±16 | 7 |
| 4 | xxs | ±17～±20 | 8 |
| 5 | xxs | ±21～±24 | 9 |
| 6 | xxs | ±25～±28 | 10 |
| 7 | xxs | ±29～±32 | 11 |
| 8 | xxs | ±33～±36 | 12 |
| 9 | xxs | ±37～±40 | 13 |
| 10 | xxs | ±41～±44 | 14 |
| 11 | xxs | ±45～±48 | 15 |
| 12 | xxs | ±49～±52 | 16 |
| 13 | xxs | ±53～±56 | 17 |
| 14 | xxs | ±57～±60 | 18 |
| 15 | xxxx xxxx xxxs | ±61～±2063 | 28 |

FIG. 7

| level_prefix | level_suffix_code | level | vlcLength |
|---|---|---|---|
| 0 | xxxs | ±1~±8 | 5 |
| 1 | xxxs | ±9~±16 | 6 |
| 2 | xxxs | ±17~±24 | 7 |
| 3 | xxxs | ±25~±32 | 8 |
| 4 | xxxs | ±33~±40 | 9 |
| 5 | xxxs | ±41~±48 | 10 |
| 6 | xxxs | ±49~±56 | 11 |
| 7 | xxxs | ±57~±64 | 12 |
| 8 | xxxs | ±65~±72 | 13 |
| 9 | xxxs | ±73~±80 | 14 |
| 10 | xxxs | ±81~±88 | 15 |
| 11 | xxxs | ±89~±96 | 16 |
| 12 | xxxs | ±97~±104 | 17 |
| 13 | xxxs | ±105~±112 | 18 |
| 14 | xxxs | ±113~±120 | 19 |
| 15 | xxxx xxxx xxxs | ±121~±2063 | 28 |

FIG. 8

| level_prefix | level_suffix_code | level | vlcLength |
|---|---|---|---|
| 0 | xxxx s | ±1~±16 | 6 |
| 1 | xxxx s | ±17~±32 | 7 |
| 2 | xxxx s | ±33~±48 | 8 |
| 3 | xxxx s | ±49~±64 | 9 |
| 4 | xxxx s | ±67~±80 | 10 |
| 5 | xxxx s | ±81~±96 | 11 |
| 6 | xxxx s | ±97~±112 | 12 |
| 7 | xxxx s | ±113~±128 | 13 |
| 8 | xxxx s | ±129~±144 | 14 |
| 9 | xxxx s | ±145~±160 | 15 |
| 10 | xxxx s | ±161~±176 | 16 |
| 11 | xxxx s | ±177~±192 | 17 |
| 12 | xxxx s | ±193~±208 | 18 |
| 13 | xxxx s | ±209~±224 | 19 |
| 14 | xxxx s | ±225~±240 | 20 |
| 15 | xxxx xxxx xxxs | ±241~±2063 | 28 |

FIG. 9

| level_prefix | level_suffix_code | level | vlcLength |
|---|---|---|---|
| 0 | xxxx xs | ±1~±32 | 7 |
| 1 | xxxx xs | ±33~±64 | 8 |
| 2 | xxxx xs | ±65~±96 | 9 |
| 3 | xxxx xs | ±97~±128 | 10 |
| 4 | xxxx xs | ±129~±160 | 11 |
| 5 | xxxx xs | ±161~±192 | 12 |
| 6 | xxxx xs | ±193~±224 | 13 |
| 7 | xxxx xs | ±225~±256 | 14 |
| 8 | xxxx xs | ±257~±288 | 15 |
| 9 | xxxx xs | ±289~±320 | 16 |
| 10 | xxxx xs | ±321~±352 | 17 |
| 11 | xxxx xs | ±353~±384 | 18 |
| 12 | xxxx xs | ±385~±416 | 19 |
| 13 | xxxx xs | ±417~±448 | 20 |
| 14 | xxxx xs | ±449~±480 | 21 |
| 15 | xxxx xxxx xxxs | ±481~±2063 | 28 |

FIG. 10

| SuffixLength | THRESHOLD |
|---|---|
| 0 | 0 |
| 1 | 3 |
| 2 | 6 |
| 3 | 12 |
| 4 | 24 |
| 5 | 48 |
| 6 | |

VARIABLE-LENGTH CODE DECODING APPARATUS AND METHOD

FIELD OF THE INVENTION

The present invention relates to a decoding apparatus and its method for code streams of a still image or moving image and, more particularly, to a variable-length code decoding apparatus and its method which decode a variable-length code containing a prefix and a suffix.

BACKGROUND OF THE INVENTION

Image signal coding technology is used for the transmission and storage/playback of image signals of still images, moving images, and the like. A few international standardized coding schemes are already widely used such as CCITT Rec. T. 81 (JPEG) for still images coding, and ISO/IEC International Standard 14496-2 (MPEG-4 Visual) for moving images coding.

Also, a newer coding scheme, namely, ITU-T Rec. H. 264 Advanced Video Coding|ISO/IEC International Standard 14496-10 (MPEG-4 AVC) to be referred to as H. 264 hereinafter is a moving image coding scheme based on the joint international standardization of ITU-T and ISO/IEC.

In an image signal, spatially adjacent pixels have a large correlation. Therefore, when the signal is transformed into a frequency domain, information is locally distributed in a low-frequency region, and redundancy can be reduced by using this local distribution of information. In general image coding schemes, orthogonal transformations are performed to transform an image signal into orthogonal transformation coefficients in the frequency domain in order for signal components to be locally distributed in a low-frequency region. In addition, these coefficient values are quantized to set coefficients with small values to zero values. The coefficients are then sequentially read out, starting from the low-frequency region, to form a coefficient sequence. Then, entropy coding is performed using the local distribution of coefficient values to realize efficient coding with reduced redundancy.

In this case, to perform orthogonal transformations, the discrete cosine transform (DCT) is widely used for its coding efficiency and its ease of implementation. Orthogonal transformations such as DCT are performed for each block obtained by dividing an image signal each of them comprising a plurality of pixels.

If image signals undergo small changes in their spatial properties, image signals transformed into orthogonal transformation coefficients in similar frequency regions are widely distributed on the image. Increasing the size of each block, i.e., the size of an orthogonal transformation makes it possible to further reduce redundancy and improve coding efficiency as compared with a case wherein small blocks are used leading to similar and redundant orthogonal transformation coefficients. In contrast, if image signals undergo large changes in spatial properties, larger block sizes lead to a reduction in local distribution of coefficients each of them including various frequency components. This makes it difficult to perform efficient entropy coding, resulting in a decrease in coding efficiency.

According to H. 264, entropy coding for orthogonal transformation coefficients obtained by orthogonal transformation is performed with respect to a coefficient sequence obtained by sequentially reading out orthogonal transformation coefficients, starting from a high-frequency region. FIG. 1A shows the readout order of coefficients in a 4×4 pixel orthogonal transformation block. The coefficients obtained by orthogonal transformation are arranged with the lowest frequency component (i.e., a DC component) being located at the upper left position. Therefore, by sequentially reading out coefficients from an orthogonal transformation block like that shown in FIG. 1B, starting from the upper left position, a coefficient sequence comprising 16 coefficients like that shown in FIG. 1C is obtained. Such a readout order is referred to as a zigzag scan.

Correlation absence is set among coefficients obtained by orthogonal transformation, and signal components are locally distributed in a low-frequency region. If these coefficients are further quantized, coefficients in a low-frequency region tend to have non-zero coefficient values, and many coefficients with zero values appear in the coefficient sequence. For example, a row of coefficient values like that shown in FIG. 1C is obtained. In order to efficiently perform entropy coding for a coefficient sequence having such a distribution, image coding is generally performed by expressing the coefficient sequence using the number of consecutive zero coefficients (run) preceding each non-zero coefficient and the coefficient value (level) of each non-zero coefficient.

In order to further improve the efficiency of such entropy coding, H. 264 has adopted a technique called CAVLC (Context-based Adaptive Variable Length Code)(see Japanese Patent Application Laid-open No. 2004-134896).

According to CAVLC in H. 264, the coefficient sequence obtained from a 4×4 pixel orthogonal transformation block includes a maximum of 16 coefficients, and the runlength is limited by this maximum number. In addition, the level tends to increase going towards a lower frequency region. According these situations, many code tables, which are used for variable-length coding and optimized for the respective conditions, are prepared, and the coding efficiency is improved by sequentially switching and using them.

If, for example, the respective levels are sequentially coded from the right side (high frequency side) of the row of the coefficient values shown in FIG. 1C, many small values are generated on the right side, and larger values appear toward the left side (low frequency side). As shown in FIG. 3, a code table in which short code length vlcLength is assigned to each small level value is used at first. Code length vlcLength in this code table is relatively short, i.e., 14 bits or less, when the absolute value of a corresponding level is 7 or less. When the absolute value of a level is 8 or more, a code length of 19 bits is assigned. When the absolute value of a level is 16 or more, a code length of 28 bits is assigned. That is, the code length increases with an increase in level. As the levels coded from the right side of the row of the coefficient values shown in FIG. 1C exceed a predetermined threshold, code tables in which relatively short code lengths are assigned to even large level values as shown in FIGS. 3 to 9 are used. This makes it possible to efficiently perform entropy coding by assigning codes with a smaller number of bits.

Note that the variable-length codes of levels in CAVLC in H. 264 are comprised of prefix level_prefix_code shown in the code table in FIG. 2 and suffix level_suffix_code shown in the code tables in FIGS. 3 to 9 which is selected in accordance with suffix length suffixLength. The code tables in FIGS. 3 to 9 correspond to suffix length suffixLength of 0 to suffix length suffixLength of 6.

In the code tables in FIGS. 3 to 9, x represents the absolute value of a level, s represents the sign of the level, and each value takes 0 or 1. If, for example, suffix length suffixLength is 3, and the level is −11, prefix symbol level_prefix is 2, and suffix level_suffix_code is "101" according to FIG. 6. According to FIG. 2, when prefix symbol level_prefix is 2, prefix level_prefix_code is "001". Therefore, the variable-length code corresponding to this level is "001101".

Suffix length suffixLength is acquired on the basis of the value of a level which has already been coded. If the absolute value of the level exceeds the threshold corresponding to suffix length suffixLength in the table shown in FIG. 10, suffix length suffixLength of a subsequent variable-length code is increased by one. If the absolute value of the level does not exceed the threshold, suffix length suffixLength holds its value without change. The maximum value of suffix length suffixLength is 6.

For details regarding CAVLC, see H. 264.

A conventional variable-length code decoding apparatus which decodes a code corresponding to a level in CAVLC described above has, for example, the arrangement shown in FIG. 11.

Referring to FIG. 11, a bit stream buffer 500 is a buffer which temporarily stores the bit stream of input variable-length codes, and a variable-length code shifter unit 501 supplies a variable-length code to be decoded in the next clock cycle on the basis of code length vlcLength of the decoded variable-length code output from a level decoding unit 503. The supplied variable-length code delayed by a delay unit 502 is decoded by the level decoding unit 503.

The level decoding unit 503 decodes the level from the input variable-length code on the basis of suffix length suffixLength acquired in advance by a suffix length acquiring unit 504 and the code tables shown in FIGS. 3 to 9, and outputs the level value and code length vlcLength. The suffix length acquiring unit 504 compares the absolute value of the decoded level with a threshold corresponding to suffix length suffixLength shown in FIG. 10, and increases suffix length suffixLength by one if the absolute value exceeds the threshold. Note that the initial value of suffix length suffixLength is 0, and is initialized at the beginning of the decoding of an orthogonal transformation block.

However, in the conventional variable-length code decoding apparatus, the code length vlcLength necessary for supplying the next variable-length code cannot be known until the end of decoding by the level decoding unit 503. The level decoding unit 503 has an arrangement like that shown in FIG. 12. Suffix code tables 5032 to 5038 respectively comprise the code tables shown in FIGS. 3 to 9. If these tables are implemented as a system LSI circuit, a critical path from level decoding processing to code supplying processing (a loop from the output of the delay unit 502 to the input of the delay unit 502) increases in length. This makes it impossible to increase the operating frequency. If such a conventional variable-length code decoding apparatus is incorporated in a moving image decoding apparatus, the decoding processing speed of the variable-length code decoding apparatus becomes a bottleneck, resulting in the problem that the processing speed of moving image decoding cannot be increased.

This leads to the inconvenience of decreasing the image size and frame rate so as to allow real-time decoding.

SUMMARY OF THE INVENTION

The present invention has been made to solve the above problems, and provides a variable-length code decoding technique for realizing high-speed decoding processing without decreasing an image size or frame rate.

A variable-length code decoding apparatus according to an aspect of the present invention decodes a variable-length code containing a prefix and a suffix and comprises a prefix decoding unit which decodes a prefix of an input variable-length code and outputs a symbol and prefix length corresponding to the prefix, a suffix shifter unit which supplies the suffix on the basis of the prefix length output from the prefix decoding unit, and a symbol decoding unit which decodes a symbol corresponding to a variable-length code on the basis of the symbol corresponding to the prefix which is output from the prefix decoding unit, the suffix supplied by the suffix shifter unit, and a suffix length acquired in advance.

A variable-length code decoding apparatus according to another aspect of the present invention decodes N adjacent variable-length codes each containing a prefix and a suffix and comprises N prefix decoding units which decode prefixes of input variable-length codes and output symbols and prefix lengths corresponding to the prefixes, N suffix shifter units which supply the suffixes on the basis of the prefix lengths output from the prefix decoding units, and N symbol decoding units which decode symbols corresponding to variable-length codes on the basis of the symbols corresponding to the prefixes which are output from the prefix decoding units, the suffixes supplied by the suffix shifter units, and the suffix lengths acquired on the basis of already decoded symbols.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A to 1C are views showing an example of the zigzag scan order of orthogonal transformation coefficients in a block and transformation coefficients;

FIG. 2 is a view showing a code table of prefix level_prefix_code;

FIG. 3 is a view showing a code table of suffix level_suffix_code with suffix length suffixLength=0;

FIG. 4 is a view showing a code table of suffix level_suffix_code with suffix length suffixLength=1;

FIG. 5 is a view showing a code table of suffix level_suffix_code with suffix length suffixLength=2;

FIG. 6 is a view showing a code table of suffix level_suffix_code with suffix length suffixLength=3;

FIG. 7 is a view showing a code table of suffix level_suffix_code with suffix length suffixLength=4;

FIG. 8 is a view showing a code table of suffix level_suffix_code with suffix length suffixLength=5;

FIG. 9 is a view showing a code table of suffix level_suffix_code with suffix length suffixLength=6;

FIG. 10 is a view showing thresholds used for the acquisition of suffix length suffixLength;

DETAILED DESCRIPTION OF THE PREFERRED EMBODIMENTS

Preferred embodiments of the present invention will now be described in detail in accordance with the accompanying drawings.

First Embodiment

Figure 11:
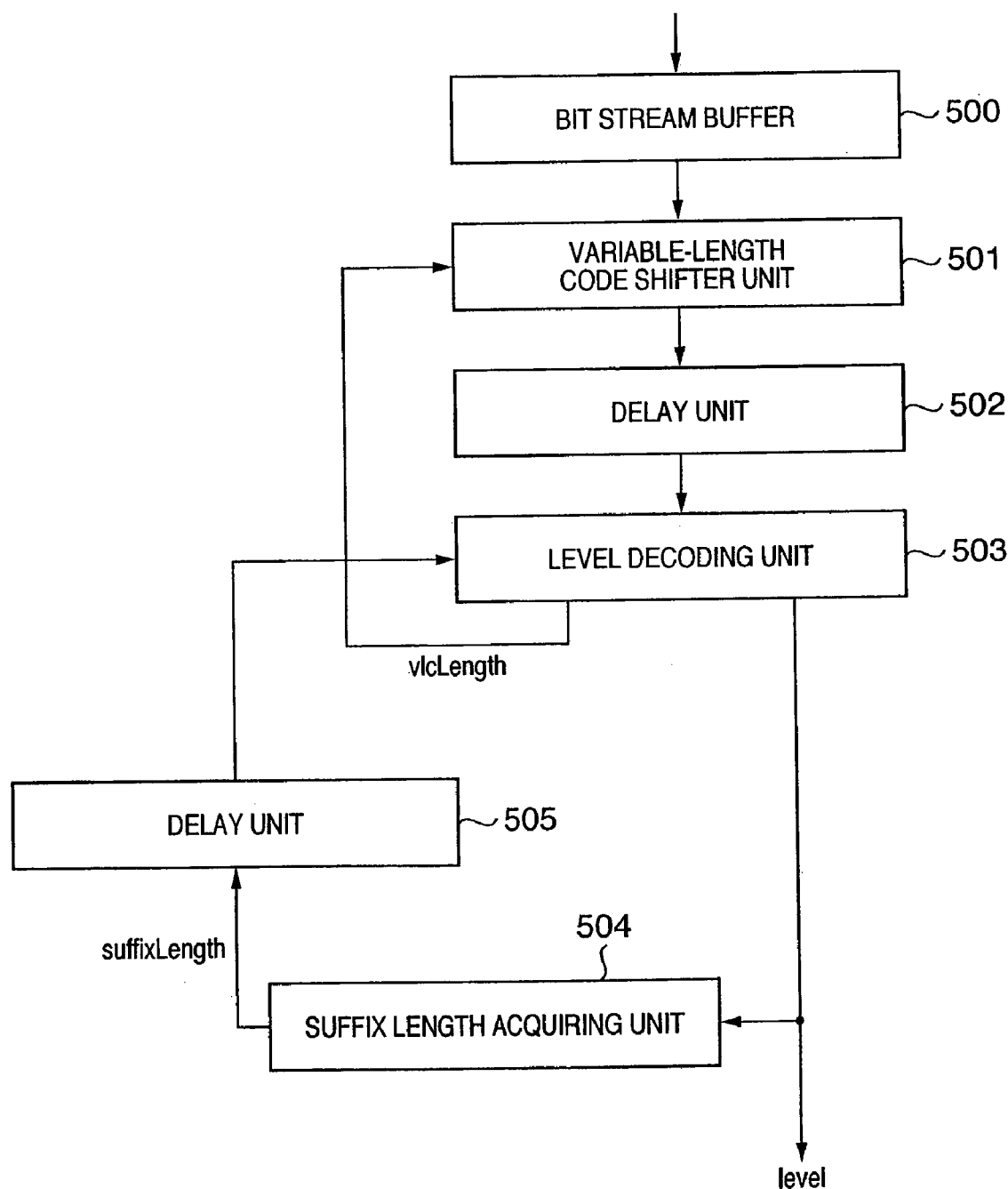
FIG. 11 is a block diagram showing the arrangement of a conventional variable-length code decoding apparatus.
Figure 12:
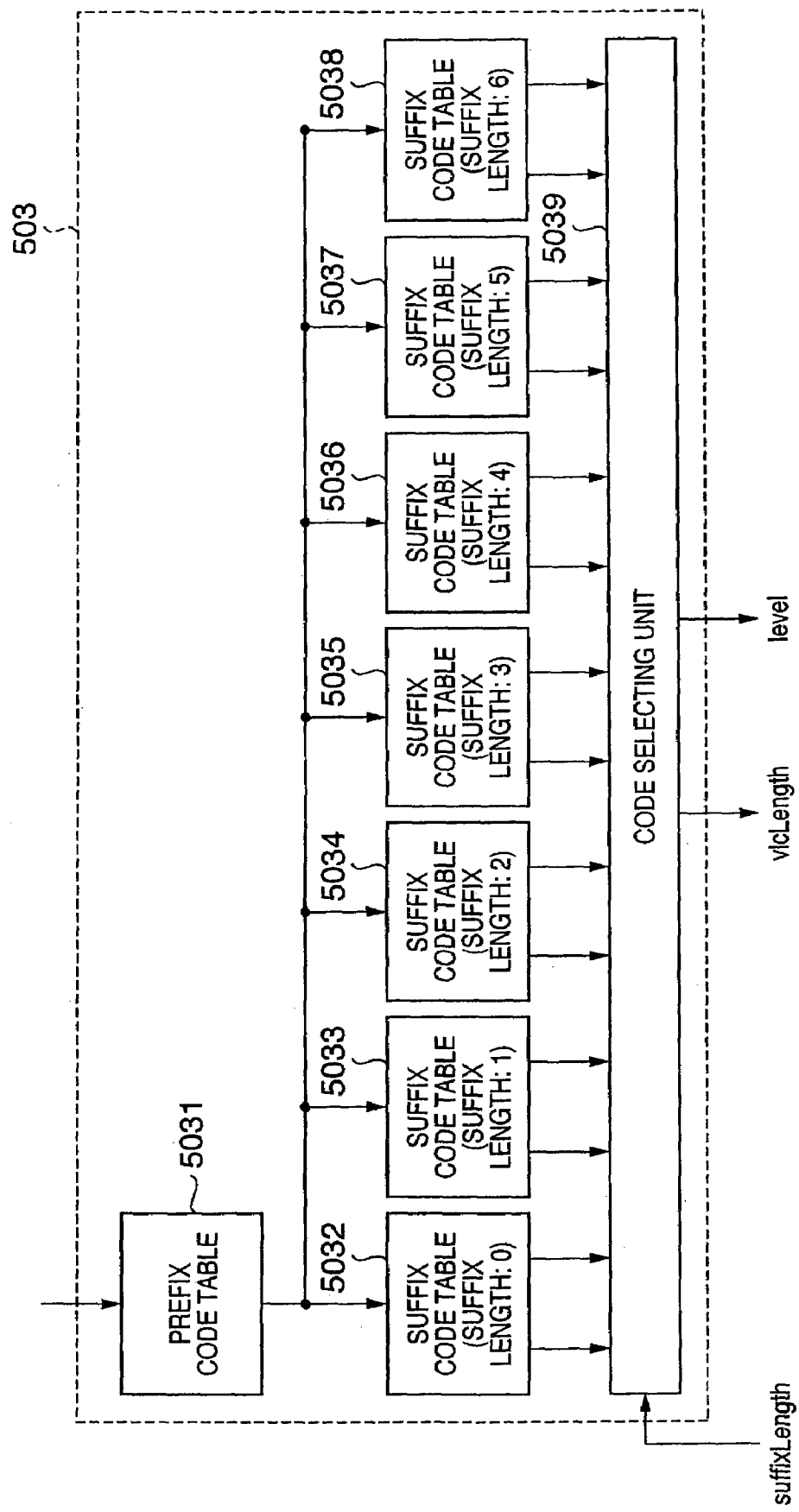
FIG. 12 is a block diagram showing the arrangement of the level decoding unit of the conventional variable-length code decoding apparatus.
Figure 13:
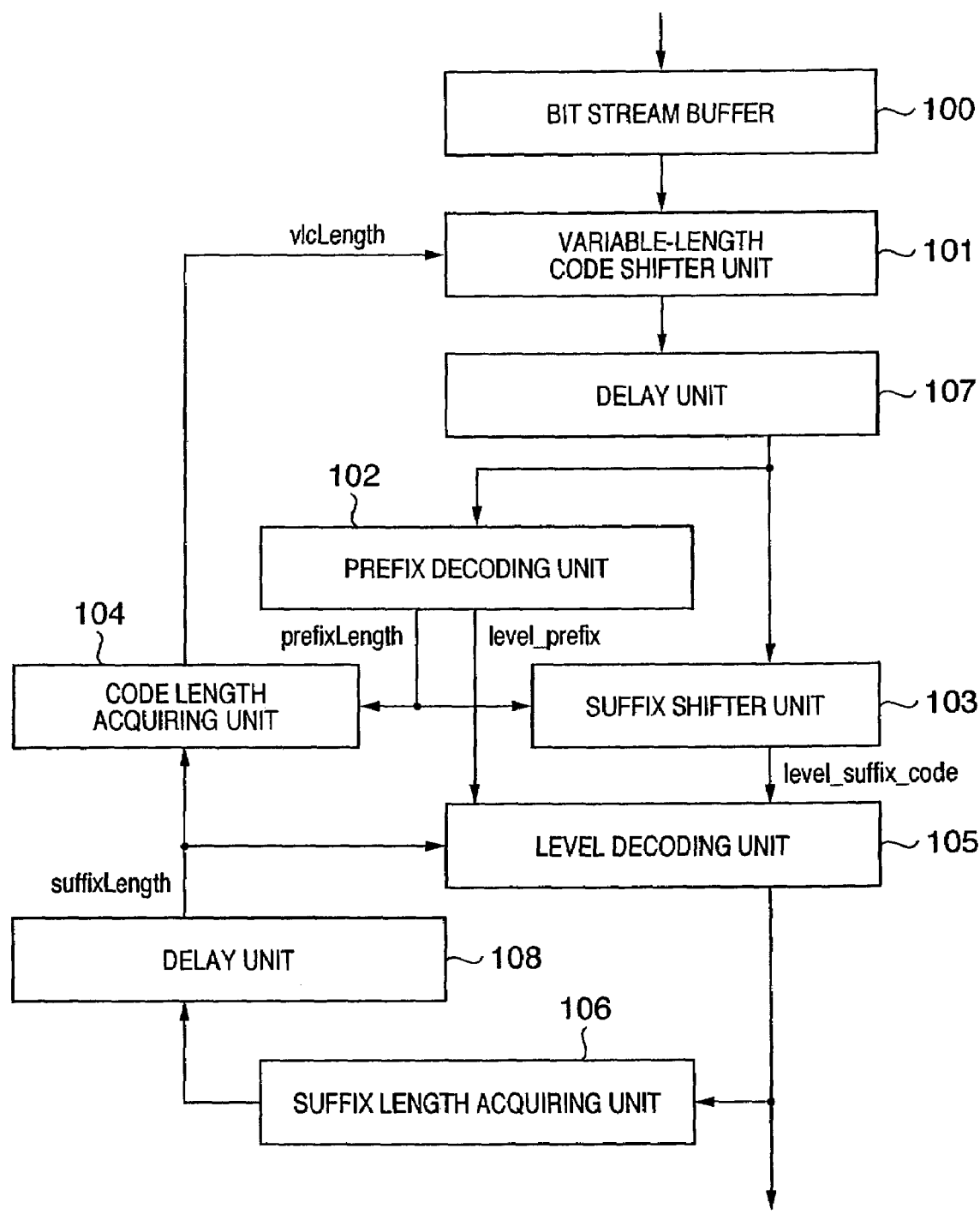
FIG. 13 is a block diagram showing the arrangement of a variable-length code decoding apparatus according to the first embodiment of the present invention.

FIG. 13 shows the arrangement of a variable-length code decoding apparatus according to the first embodiment of the present invention.

The variable-length code decoding apparatus of this embodiment comprises a bit stream buffer 100, variable-length code shifter unit 101, prefix decoding unit 102, suffix shifter unit 103, code length acquiring unit 104, level decoding unit 105, suffix length acquiring unit 106, and delay units 107 and 108. The operation of the variable-length code decoding apparatus according to this embodiment will be described below with reference to FIGS. 1A to 1C.

The bit stream buffer 100 is a buffer which temporarily stores the bit stream of input variable-length codes. On the basis of code length vlcLength of a variable-length code, which has already been coded, acquired by the code length acquiring unit 104 (to be described later), the variable-length code shifter unit 101 receives a variable-length code from the bit stream buffer 100 and supplies the next variable-length code. The variable-length code output from the variable-length code shifter unit 101 is delayed by the delay unit 107 by one cycle, and is input to the prefix decoding unit 102 and the suffix shifter unit 103.

The prefix decoding unit 102 obtains prefix symbol level_prefix and prefix length prefixLength from the variable-length code input from the delay unit 107 on the basis of the code table shown in FIG. 2. If, for example, "001101 . . . " is input from the delay unit 107, since prefix level_prefix_code is "001", prefix symbol level_prefix is "2", and prefix length prefixLength is "3". Prefix symbol level_prefix is output to the level decoding unit 105, and prefix length prefixLength is output to the suffix shifter unit 103 and the code length acquiring unit 104.

Figure 14:
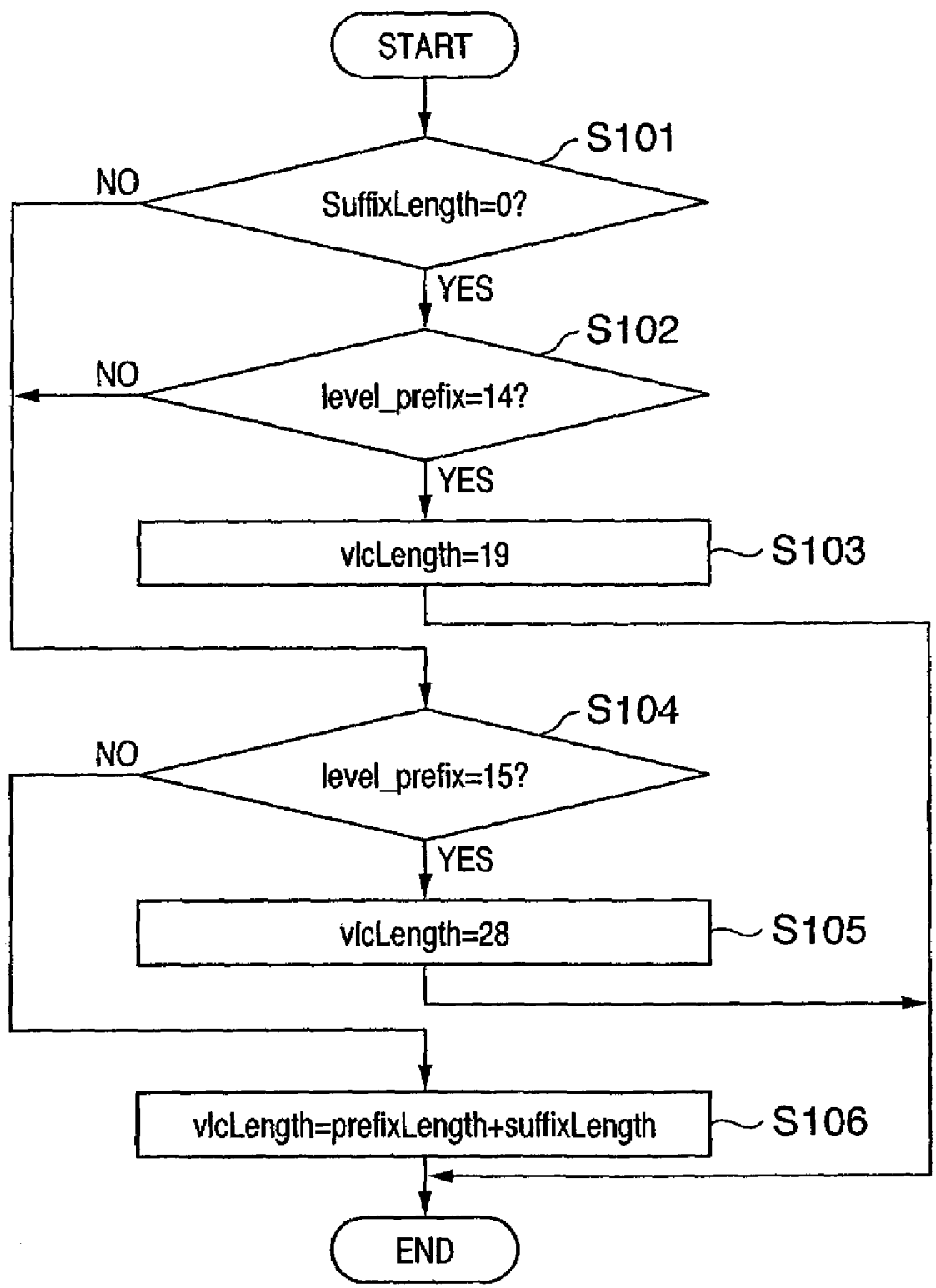
FIG. 14 is a flowchart for explaining the processing operation of a code length acquiring unit 104, first code length acquiring unit 205, and second code length acquiring unit 211.

The code length acquiring unit 104 acquires code length vlcLength of the variable-length code comprising prefix level_prefix_code and suffix level_suffix_code from prefix length prefixLength input from the prefix decoding unit 102 and suffix length suffixLength output from the suffix length acquiring unit 106 (to be described later) and delayed by the delay unit 108 by one cycle in accordance with the flowchart shown in FIG. 14. FIG. 14 will be described below. Note that this flowchart is controlled by a sequencer (not shown) included in the decoding apparatus.

In step S101, it is determined whether suffix length suffixLength is 0. If suffixLength is 0, the flow advances to step S102. In step S102, it is determined whether prefix symbol level_prefix is 14.

If it is determined in step S102 that prefix symbol level_prefix is 14, the flow advances to step S103 to determine that code length vlcLength is 19.

If it is determined in step S101 that suffix length suffixLength is not 0, or if it is determined in step S102 that prefix symbol level_prefix is not 14, the flow advances to step S104.

It is determined in step S104 whether prefix symbol level_prefix is 15. If it is determined that prefix symbol level_prefix is 15, the flow advances to step S105 to determine that code length vlcLength is 28.

If it is determined in step S104 that prefix symbol level_prefix is not 15, the flow advances to step S106 to perform control to make code length vlcLength equal to the sum of prefix length prefixLength and suffix length suffixLength.

Code length vlcLength acquired by the above operation is supplied to the variable-length code shifter unit 101. Note that in the flowchart of FIG. 14, prefix symbol level_prefix has a threshold of 14 or 15 to conform to H. 264.

The suffix shifter unit 103 supplies suffix level_suffix_code following prefix level_prefix_code from the variable-length code input from the delay unit 107 on the basis of prefix length prefixLength input from the prefix decoding unit 102. If, for example, the variable-length code input from the delay unit 107 is "001101 . . . " and prefix length prefixLength input from the prefix decoding unit 102 is 3, the suffix shifter unit 103 discards the upper three bits and supplies suffix level_suffix_code "101 . . . ".

The level decoding unit 105 decodes a level by using the code tables shown in FIGS. 3 to 9 on the basis of prefix symbol level_prefix input from the prefix decoding unit 102, suffix level_suffix_code supplied from the suffix shifter unit 103, and suffix length suffixLength output from the suffix length acquiring unit 106 (to be described later) and delayed by the delay unit 108 by one cycle. Assume that prefix symbol level_prefix is 2, suffix level_suffix_code is "101 . . . ", and suffix length suffixLength is 3. In this case, xxs="101" and the level is −11 according to the code table shown in FIG. 6.

Note that the level decoding unit 105 includes the code tables shown in FIGS. 3 to 9, but does not have any entry for code length vlcLength because code length vlcLength is acquired by the code length acquiring unit 104.

The suffix length acquiring unit 106 determines whether the absolute value of a level decoded by the level decoding unit 105 exceeds a threshold corresponding to suffix length suffixLength written in the table shown in FIG. 10. If the absolute value of the level exceeds the threshold corresponding to suffix length suffixLength, one is added to suffix length suffixLength, and the resultant data is output. Otherwise, suffix length suffixLength is output without any change. Note that the initial value of suffix length suffixLength is 0, and is initialized at the head of an orthogonal transformation block.

Suffix length suffixLength acquired by the suffix length acquiring unit 106 is delayed by the delay unit 108 by one cycle, and is used for the decoding of a subsequent variable-length code.

As described above, in the variable-length code decoding apparatus of this embodiment, the code length acquiring unit 104 acquires code length vlcLength necessary for the variable-length code shifter unit 101 to supply a variable-length code on the basis of prefix length prefixLength output from the prefix decoding unit 102 and suffix length suffixLength acquired by the suffix length acquiring unit 106 in advance before one cycle. That is, a code length necessary for supplying is acquired before the completion of decoding by the level decoding unit 105. Therefore, the critical path of the circuit (the loop from the output of the delay unit 107 to the input of the delay unit 107) can be shortened, and the operating frequency can be increased. This makes it possible to increase the processing speed.

Second Embodiment

Figure 15:
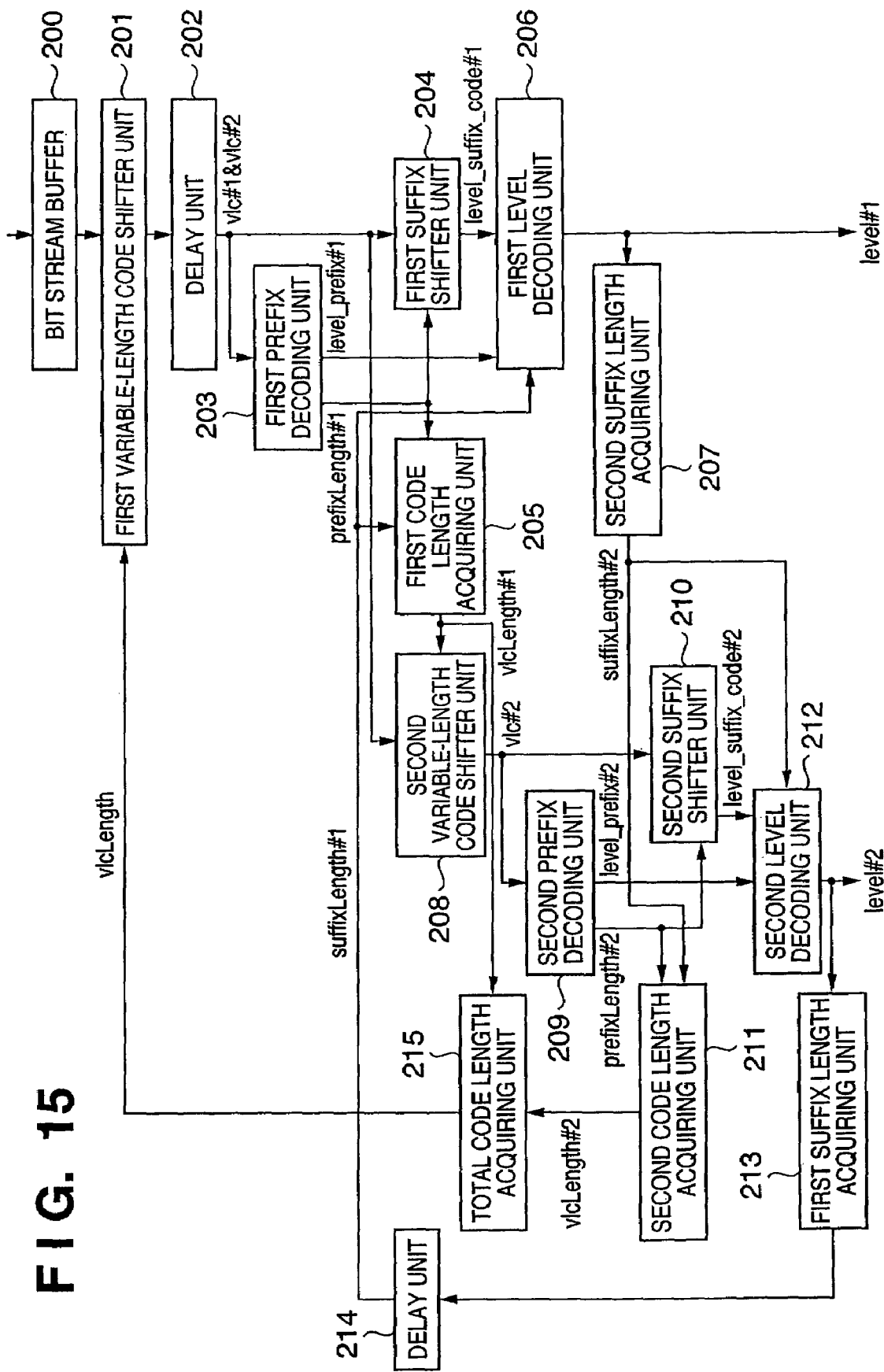
FIG. 15 is a block diagram showing the arrangement of a variable-length code decoding apparatus according to the second embodiment of the present invention.

A variable-length code decoding apparatus according to the second embodiment of the present invention will be described next. FIG. 15 shows the arrangement of the variable-length code decoding apparatus according to this embodiment. The variable-length code decoding apparatus of the embodiment decodes two consecutive variable-length codes in one cycle.

The variable-length code decoding apparatus of this embodiment comprises a bit stream buffer 200, first variable-length code shifter unit 201, first prefix decoding unit 203, first suffix shifter unit 204, first code length acquiring unit 205, first level decoding unit 206, second suffix length acquiring unit 207, second variable-length code shifter unit 208, second prefix decoding unit 209, second suffix shifter unit 210, second code length acquiring unit 211, second level decoding unit 212, first suffix length acquiring unit 213, total code length acquiring unit 215, delay unit 214, and delay unit 202. The operation of the variable-length code decoding apparatus of the embodiment will be described below with reference to FIG. 15.

The bit stream buffer 200 is a buffer which temporarily stores the bit stream of input variable-length codes. On the basis of code lengths vlcLengths of two consecutive variable-length codes, which have already been coded, acquired by the total code length acquiring unit 215 (to be described later), the first variable-length code shifter unit 201 receives variable-length codes from the bit stream buffer and supplies the next two consecutive variable-length codes. Two consecutive variable-length codes vlc#1 and vlc#2 output from the first variable-length code shifter unit 201 are delayed by the delay unit 202 by one cycle, and are input to the first prefix decoding unit 203 and the first suffix shifter unit 204.

The operation of the variable-length code decoding apparatus of this embodiment will be described on the assumption that two consecutive variable-length codes vlc#1 and vlc#2 which are output from the first variable-length code shifter unit 201 and delayed by the delay unit 202 are "0001000101 . . . ".

The first prefix decoding unit 203 obtains first prefix symbol level_prefix#1 and first prefix length prefixLength#1 from the variable-length codes input from the delay unit 202 on the basis of the code table shown in FIG. 2. According to FIG. 2, if "0001000101 . . . " is input from the delay unit 202, first prefix symbol level_prefix#1 is 3, and first prefix length prefixLength#1 is 4. First prefix symbol level_prefix#1 is output to the first level decoding unit 206, and first prefix length prefixLength#1 is output to the first suffix shifter unit 204 and the first code length acquiring unit 205.

The first code length acquiring unit 205 acquires code length vlcLength#1 (to be written as first code length vlcLength#1 hereinafter) of variable-length code vlc#1 comprising first prefix level_prefix_code#1 and first suffix level_suffix_code#1 according to the flowchart of FIG. 14 on the basis of first prefix length prefixLength#1 input from the first prefix decoding unit 203 and first suffix length suffix-Length#1 output from the first suffix length acquiring unit 213 (to be described later) and delayed by the delay unit 214 by one cycle. If first prefix length prefixLength#1 is 4 and first suffix length suffixLength#1 is 1, first code length vlcLength#1 is 5. Acquired first code length vlcLength#1 is input to the second variable-length code shifter unit 208 and the total code length acquiring unit 215.

The first suffix shifter unit 204 supplies first suffix level_suffix_code #1 following first prefix level_prefix_code#1 from the variable-length codes input from the delay unit 202 on the basis of first prefix length prefixLength#1 input from the first prefix decoding unit 203. If, for example, the variable-length codes input from the delay unit 202 are "0001000101 . . . " and first prefix length prefixLength#1 input from the first prefix decoding unit 203 is 4, the first suffix shifter unit 204 discards the upper four bits and supplies the code "000101 . . . " containing first suffix level_suffix_code #1.

The first level decoding unit 206 decodes first level level#1 from first prefix symbol level_prefix#1 input from the first prefix decoding unit 203, first suffix level_suffix_code #1 supplied from the first suffix shifter unit 204, and first suffix length suffixLength#1 output from the first suffix length acquiring unit 213 (to be described later) and delayed by the delay unit 214 by one cycle on the basis of the code tables shown in FIGS. 3 to 9. Assume that first prefix symbol level_prefix#1 is 3, the code containing first suffix level_suffix_code#1 is "000101 . . . ", and first suffix length suffixLength#1 is 1. In this case, according to FIG. 4, first level level#1 is 4.

Note that the first level decoding unit 206 includes the code tables shown in FIGS. 3 to 9, but does not have any entry for first code length vlcLength#1 because first code length vlcLength#1 is acquired by the first code length acquiring unit 205.

The second suffix length acquiring unit 207 determines whether the absolute value of first level level#1 decoded by the first level decoding unit 206 exceeds a threshold corresponding to suffix length suffixLength written in the table shown in FIG. 10. If the absolute value of first level level#1 exceeds the threshold, one is added to first suffix length suffixLength#1, and the resultant data is output as second suffix length suffixLength#2. If the absolute value of first level level#1 does not exceed the threshold, first suffix length suffixLength#1 is output as second suffix length suffixLength#2 without any change. If, for example, first level level#1 is 4 and first suffix length suffixLength#1 is 1, since the absolute value of first level level#1 exceeds the threshold, second suffix length suffixLength#2 is 2. Note that the initial value of first suffix length suffixLength#1 is 0, and is initialized at the beginning of the orthogonal transformation block.

Second suffix length suffixLength#2 acquired by the second suffix length acquiring unit 207 is input to the second code length acquiring unit 211 and the second level decoding unit 212 and is used for the decoding of a subsequent variable-length code.

The second variable-length code shifter unit 208 supplies second variable-length code vlc#2 following first variable-length code vlc#1 from two consecutive variable-length codes vlc#1 and vlc#2 input from the delay unit 202 on the basis of first code length vlcLength#1 input from the first code length acquiring unit 205. If, for example, "0001000101 . . . " is input from the delay unit 202 and first code length vlcLength#1 is 5, second variable-length code vlc#2 is "00101 . . . ".

The second prefix decoding unit 209 obtains second prefix symbol level_prefix#2 and second prefix length prefix-Length#2 from second variable-length code vlc#2 input from the second variable-length code shifter unit 208 on the basis of the code table shown in FIG. 2. If, for example, second variable-length code vlc#2 is "00101 . . . ", second prefix symbol level_prefix#2 is 2, and second prefix length prefixLength#2 is 3. Second prefix symbol level_prefix#2 is output to the second level decoding unit 212. Second prefix length prefixLength#2 is output to the second suffix shifter unit 210 and the second code length acquiring unit 211.

The second code length acquiring unit 211 acquires code length vlcLength#2 (to be written as second code length vlcLength#2 hereinafter) of second variable-length code vlc#2 comprising second prefix level_prefix_code #2 and second suffix level_suffix_code#2 on the basis of second prefix length prefixLength#2 input from the second prefix decoding unit 209 and second suffix length suffixLength#2 output from the second suffix length acquiring unit 207 in accordance with the flowchart shown in FIG. 14. If, for example, second prefix length prefixLength#2 is 3 and second suffix length suffixLength#2 is 2, second code length vlcLength#2 is 5. Acquired second code length vlcLength#2 is output to the total code length acquiring unit 215.

The second suffix shifter unit 210 supplies second suffix level_suffix_code#2 following second prefix level_prefix_code#2 from second variable-length code vlc#2 input from the second variable-length code shifter unit 208 on the basis of second prefix length prefixLength#2 input from the second prefix decoding unit 209. If, for example, second variable-length code vlc#2 is "00101 . . . " and second prefix length prefixLength#2 is 3, second suffix level_suffix_code#2 is "01 . . . ".

The second level decoding unit 212 decodes second level level#2 from second prefix symbol level_prefix#2 input from the second prefix decoding unit 209, second suffix level_suffix_code#2 supplied from the second suffix shifter unit 210, and second suffix length suffixLength#2 output from the second suffix length acquiring unit 207 on the basis of the code tables shown in FIGS. 3 to 9. Assume that second prefix symbol level_prefix#2 is 2, second suffix level_suffix_code#2 is "01 . . . ", and second suffix length suffixLength#2 is 2. In this case, according to FIG. 5, second level level#2 is −5.

The second level decoding unit 212 includes the code tables shown in FIGS. 3 to 9, but does not have any entry for second code length vlcLength#2 because second code length vlcLength#2 is acquired by the second code length acquiring unit 211.

The first suffix length acquiring unit 213 determines whether the absolute value of second level level#2 decoded by the second level decoding unit 212 exceeds a threshold corresponding to suffix length suffixLength written in the table shown in FIG. 10. If the absolute value of second level level#2 exceeds the threshold, one is added to second suffix length suffixLength#2, and the resultant data is output as first suffix length suffixLength#1 of the subsequent variable-length code to be decoded in the next cycle. If the absolute value of second level level#2 does not exceed the threshold, second suffix length suffixLength#2 is output as first suffix length suffixLength#1 without any change. If, for example, second suffix length suffixLength#2 is 2 and second level level#2 is −5, since the absolute value does not exceed the threshold, first suffix length suffixLength#1 of the subsequent variable-length code is 2. Note that the initial value of first suffix length suffixLength#1 is 0, and is initialized at the beginning of the orthogonal transformation block.

First suffix length suffixLength#1 acquired by the first suffix length acquiring unit 213 is output to the delay unit 214, and is used for the decoding of the subsequent variable-length code to be decoded in the next cycle.

The total code length acquiring unit 215 adds two code lengths vlcLength#1 and vlcLength#2 acquired by the first code length acquiring unit 205 and the second code length acquiring unit 211, and outputs total code length vlcLengths of two consecutive decoded variable-length codes vlc#1 and vlc#2.

As described above, in the variable-length code decoding apparatus of the second embodiment, the first code length acquiring unit 205 acquires first code length vlcLength#1 which is necessary for the second variable-length code shifter unit 208 to supply second variable-length code vlc#2 on the basis of first prefix length prefixLength#1 output from the first prefix decoding unit 203 and first suffix length suffixLength#1 acquired by the first suffix length acquiring unit 213 before one cycle. That is, a code length necessary to supply second variable-length code vlc#2 is acquired before the completion of coding by the first level decoding unit 206.

In addition, the total code length acquiring unit 215 acquires total code length vlcLengths necessary to supply a variable-length code to be decoded in the next cycle on the basis of first code length vlcLength#1 acquired by the first code length acquiring unit 205 and second code length vlcLength#2 acquired by the second code length acquiring unit 211. That is, total code length vlcLengths is acquired before the completion of decoding by the second level decoding unit 212.

Therefore, the critical path of the circuit (the loop from the output of the delay unit 202 to the input of the delay unit 202) which decodes two variable-length codes in one cycle can be shortened, and the operating frequency can be increased. This makes it possible to increase the processing speed.

Note that the second embodiment has exemplified the decoding of two adjacent variable-length codes. However, according to the idea of the present invention, the number of adjacent codes is not limited to two, and the present invention can be applied to an arbitrary number (N) of codes as long as the processing power of the system permits.

As has been described above, in the variable-length code decoding apparatus of the present invention, since the length of a variable-length code used for supplying a variable-length code is acquired on the basis of the length of a prefix output from the prefix decoding unit and the length of a suffix acquired in advance, the next variable-length code can be supplied without using the decoding result obtained by the symbol decoding unit. Therefore, the critical path of the circuit decreases, and the operating frequency can be easily increased. This makes it possible to perform high-speed decoding processing. In addition, decoding a plurality of variable-length codes in one clock cycle makes it possible to perform faster decoding processing.

Other Embodiments

Note that the present invention can be applied to an apparatus comprising a single device or to system constituted by a plurality of devices.

Furthermore, the invention can be implemented by supplying a software program, which implements the functions of the foregoing embodiments, directly or indirectly to a system or apparatus, reading the supplied program code with a computer of the system or apparatus, and then executing the program code. In this case, so long as the system or apparatus has the functions of the program, the mode of implementation need not rely upon a program.

Accordingly, since the functions of the present invention are implemented by computer, the program code installed in the computer also implements the present invention. In other words, the claims of the present invention also cover a computer program for the purpose of implementing the functions of the present invention.

In this case, so long as the system or apparatus has the functions of the program, the program may be executed in any form, such as an object code, a program executed by an interpreter, or scrip data supplied to an operating system.

Example of storage media that can be used for supplying the program are a floppy disk, a hard disk, an optical disk, a magneto-optical disk, a CD-ROM, a CD-R, a CD-RW, a magnetic tape, a non-volatile type memory card, a ROM, and a DVD (a DVD-ROM, a DVD-R and a DVD-RW).

As for the method of supplying the program, a client computer can be connected to a website on the Internet using a browser of the client computer, and the computer program of the present invention or an automatically-installable compressed file of the program can be downloaded to a recording medium such as a hard disk. Further, the program of the present invention can be supplied by dividing the program code constituting the program into a plurality of files and downloading the files from different websites. In other words, a WWW (World Wide Web) server that downloads, to multiple users, the program files that implement the functions of the present invention by computer is also covered by the claims of the present invention.

It is also possible to encrypt and store the program of the present invention on a storage medium such as a CD-ROM, distribute the storage medium to users, allow users who meet certain requirements to download decryption key information from a website via the Internet, and allow these users to decrypt the encrypted program by using the key information, whereby the program is installed in the user computer.

Besides the cases where the aforementioned functions according to the embodiments are implemented by executing the read program by computer, an operating system or the like running on the computer may perform all or a part of the actual processing so that the functions of the foregoing embodiments can be implemented by this processing.

Furthermore, after the program read from the storage medium is written to a function expansion board inserted into the computer or to a memory provided in a function expansion unit connected to the computer, a CPU or the like mounted on the function expansion board or function expansion unit performs all or a part of the actual processing so that the functions of the foregoing embodiments can be implemented by this processing.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-340806 filed on Nov. 25, 2004, which is hereby incorporated by reference herein.

What is claimed is:

1. A variable-length code decoding apparatus which decodes a variable-length code containing a prefix and a suffix, comprising:
 a prefix decoding unit which decodes a prefix of an input variable-length code and outputs a symbol and prefix length corresponding to the prefix;
 a suffix shifter unit which supplies the suffix on the basis of the prefix length output from said prefix decoding unit; and
 a symbol decoding unit which decodes a symbol corresponding to a variable-length code on the basis of the symbol corresponding to the prefix which is output from said prefix decoding unit, the suffix supplied by said suffix shifter unit, and a suffix length acquired in advance.

2. The apparatus according to claim 1, further comprising:
 a code length acquiring unit which acquires a variable-length code length on the basis of the prefix length output from said prefix decoding unit and the suffix length acquired in advance; and
 a variable-length code shifter unit which supplies a variable-length code to be decoded next on the basis of the variable-length code length acquired by said code length acquiring unit.

3. The apparatus according to claim 1, further comprising a suffix length acquiring unit which acquires a suffix length of a subsequent variable-length code on the basis of a symbol decoded by said symbol decoding unit.

4. A variable-length code decoding apparatus which decodes N adjacent variable-length codes each containing a prefix and a suffix, comprising:
 N prefix decoding units which decode prefixes of input variable-length codes and output symbols and prefix lengths corresponding to the prefixes;
 N suffix shifter units which supply the suffixes on the basis of the prefix lengths output from said prefix decoding units; and
 N symbol decoding units which decode symbols corresponding to variable-length codes on the basis of the symbols corresponding to the prefixes which are output from said prefix decoding units, the suffixes supplied by said suffix shifter units, and the suffix lengths acquired on the basis of already decoded symbols.

5. The apparatus according to claim 4, further comprising:
 N code length acquiring units which acquire variable-length code lengths on the basis of the prefix lengths output from said prefix decoding units and the suffix lengths acquired by said suffix length acquiring units; and
 N variable-length code shifter units which supply next variable-length codes on the basis of the variable-length code lengths acquired by said code length acquiring unit.

6. The apparatus according to claim 4, further comprising N suffix length acquiring units which acquire suffix lengths of subsequent variable-length codes on the basis of symbols decoded by said symbol decoding units.

7. A variable-length code decoding method which decodes a variable-length code containing a prefix and a suffix, comprising:
 a prefix decoding step of decoding a prefix of an input variable-length code and outputting a symbol and prefix length corresponding to the prefix;
 a suffix supplying step of supplying the suffix on the basis of the prefix length output in the prefix decoding step; and
 a symbol decoding step of decoding a symbol corresponding to a variable-length code on the basis of the symbol corresponding to the prefix which is output in the prefix decoding step, the suffix supplied in the suffix supplying step, and a suffix length acquired in advance.

8. The method according to claim 7, further comprising:
 a code length acquiring step of acquiring a variable-length code length on the basis of the prefix length output in the prefix decoding step and the suffix length acquired in advance; and a variable-length code supplying step of supplying a variable-length code to be decoded next on the basis of the variable-length code length acquired in the code length acquiring step.

9. The method according to claim 7, further comprising a suffix length acquiring step of acquiring a suffix length of a subsequent variable-length code on the basis of a symbol decoded in the symbol decoding step.

10. A variable-length code decoding method which decodes N adjacent variable-length codes each containing a prefix and a suffix, comprising:
   a prefix decoding step of decoding prefixes of input N variable-length codes and outputting N symbols and prefix lengths corresponding to the N prefixes;
   a suffix supplying step of supplying the N suffixes on the basis of the N prefix lengths output in the prefix decoding step; and
   a symbol decoding step of decoding symbols corresponding to N variable-length codes on the basis of the N symbols corresponding to the N prefixes which are output in the prefix decoding step, the N suffixes supplied in the suffix supplying step, and the N suffix lengths acquired on the basis of already decoded symbols.

11. The method according to claim 10, further comprising:
   a code length acquiring step of acquiring N variable-length code lengths on the basis of the N prefix lengths output in the prefix decoding step and the N suffix lengths acquired in the suffix length acquiring step; and
   a variable-length code supplying step of supplying next N adjacent variable-length codes on the basis of the N variable-length code lengths acquired in the code length acquiring step.

12. The method according to claim 10, further comprising a suffix length acquiring step of acquiring suffix lengths of N subsequent variable-length codes on the basis of N symbols decoded in the symbol decoding step.

* * * * *